United States Patent
Swan et al.

(10) Patent No.: US 10,838,014 B2
(45) Date of Patent: Nov. 17, 2020

(54) METHODS AND SYSTEMS FOR DETERMINING BATTERY CHARGE OR FORMATION COMPLETENESS

(71) Applicant: Charged Engineering Inc., Cole Harbour (CA)

(72) Inventors: Lukas Swan, Cole Harbour (CA); Christopher White, Deer Lake (CA); Justin Deveau, Fredericton (CA)

(73) Assignee: Charged Engineering Inc., Cole Harbour (CA)

( * ) Notice: Subject to any disclaimer, the term of this patent is extended or adjusted under 35 U.S.C. 154(b) by 349 days.

(21) Appl. No.: 15/752,373

(22) PCT Filed: Aug. 12, 2016

(86) PCT No.: PCT/CA2016/050951
§ 371 (c)(1),
(2) Date: Feb. 13, 2018

(87) PCT Pub. No.: WO2017/024411
PCT Pub. Date: Feb. 16, 2017

(65) Prior Publication Data
US 2019/0004120 A1     Jan. 3, 2019

Related U.S. Application Data

(60) Provisional application No. 62/204,741, filed on Aug. 13, 2015.

(51) Int. Cl.
*H02J 7/00*     (2006.01)
*H02J 7/14*     (2006.01)
*G01R 31/389*   (2019.01)
*G01R 31/385*   (2019.01)
*G01R 31/36*    (2020.01)
*G01R 27/08*    (2006.01)

(52) U.S. Cl.
CPC ....... *G01R 31/389* (2019.01); *G01R 31/3648* (2013.01); *G01R 31/3865* (2019.01); *H02J 7/0021* (2013.01); *G01R 27/08* (2013.01); *Y02T 10/70* (2013.01)

(58) Field of Classification Search
USPC ......................................................... 320/107
See application file for complete search history.

(56) References Cited

U.S. PATENT DOCUMENTS

| | | | |
|---|---|---|---|
| 5,198,743 A | | 3/1993 | McClure et al. |
| 9,158,325 B1* | | 10/2015 | Lim .......................... G05F 5/00 |
| 2004/0012373 A1* | | 1/2004 | Sakakibara .......... G01R 31/389 |
| | | | 320/132 |

(Continued)

*Primary Examiner* — Alexis B Pacheco
(74) *Attorney, Agent, or Firm* — Ryan W. Dupuis; Ade + Company Inc.; Kyle R. Satterthwaite

(57) ABSTRACT

A battery charging system with a power source for charging of one or more batteries by a control module having a microprocessor for readable instruction code, controlling flow of current and voltage to the output electrical components or circuits with sensors attached to each circuit, wherein the sensors provide information at least indicative of resistance in the battery corresponding to that circuit to an analysis module for computing the rate of change of resistance and comparing the rate to a completion criterion for each battery.

20 Claims, 13 Drawing Sheets

(56) References Cited

U.S. PATENT DOCUMENTS

| | | | |
|---|---|---|---|
| 2008/0238361 A1* | 10/2008 | Pinnell | H02J 7/00041 |
| | | | 320/107 |
| 2010/0164437 A1* | 7/2010 | McKinley | H01M 10/446 |
| | | | 320/145 |
| 2011/0199055 A1* | 8/2011 | Burchardt | H02J 7/007 |
| | | | 320/148 |
| 2012/0098489 A1* | 4/2012 | Arai | B60L 50/16 |
| | | | 320/109 |
| 2013/0099720 A1* | 4/2013 | Chuah | H02J 7/0071 |
| | | | 320/101 |
| 2013/0200902 A1* | 8/2013 | Kurimoto | H01M 2/1077 |
| | | | 324/430 |
| 2014/0285156 A1* | 9/2014 | Mukaitani | G01R 31/389 |
| | | | 320/134 |
| 2015/0048778 A1 | 2/2015 | Davidson | |
| 2015/0318721 A1* | 11/2015 | Watanabe | H01M 10/441 |
| | | | 320/118 |
| 2017/0133879 A1* | 5/2017 | Eckhardt | H02J 3/386 |

\* cited by examiner

METHODS AND SYSTEMS FOR DETERMINING BATTERY CHARGE OR FORMATION COMPLETENESS

CROSS-REFERENCE TO RELATED APPLICATIONS

This application claims the benefit of U.S. Provisional Patent Application Ser. No. 62/204,741, filed Aug. 13, 2015, which is hereby incorporated by reference in its entirety.

BACKGROUND

The lead-acid battery (LAB) is an electrochemical energy storage technology commonly used in systems all over the world, including backup power, electric vehicles, ignition systems, and renewable energy. The manufacturing process of these batteries involves an energy-intensive step known as 'formation', which electrochemically activates the batteries through a long electrical charge. This process is time and energy intensive, and generally relies on empirically developed schedules with no clear indicator of completeness.

The amount of formation capacity applied to a battery determines how much discharging capacity will be available to the customer upon delivery and during subsequent cycling, where additional formation input provides diminishing additional available discharge output. In storage applications attached to the electrical grid, a customer is able to fully charge the battery as necessary and complete the formation, such that the manufacturer can "under-form" in the factory in order to reduce costs and production time. In contrast, batteries in off-grid applications rarely receive a full charge and completing the formation during operation is unlikely. Therefore, manufacturers attempt to fully form off-grid batteries before they leave the factory in order to ensure the initial performance meets the customers' expectations. Having the ability to detect completeness of charge or formation is therefore of value to a LAB manufacturer, so as to deliver the highest performance product without wasting unnecessary energy and time for manufacture.

Manufacturers of LABs must find a balance between forming cells to a minimal level to increase production rates, and forming cells excessively to maximize product performance. When product performance is favored, the formation can be conducted more efficiently if the manufacturer can detect when the diminishing returns reach a strategic threshold. There are previously known criteria for identifying when a formation is complete, each with its own set of disadvantages as described below:
1) Unchanging electrolyte concentration
2) Unchanging rate of gas evolution
3) Metallic tracks can be achieved by scratching of the formed negative active mass (NAM)
4) Dark coloration of the formed positive active mass (PAM)
5) Chemical analysis to determine the composition of $PbO_2$ in the PAM and Pb in the NAM
6) Unchanging battery charge voltage or electrode charge voltage Criterion 1) can be checked with a handheld meter periodically as a formation proceeds. Unfortunately, even if no more $SO_4^{2-}$ ions are being released into the bulk electrolyte through conversion of inactive $PbSO_4$, the loss of water through electrolysis means that the electrolyte concentration will continue to increase even after formation has completed.

Criterion 2) requires an auxiliary system for collection and analysis of evolved gases for direct measurement, but likely could be put to practice. Raman spectroscopy has been described as a measure of gas evolution rates in sealed valve-regulated lead-acid (VRLA) batteries, but this must be done invasively and would not be a practical solution in mass production. For vented cells, the naturally released gasses from any number of cells undergoing formation in a controlled enclosure could be measured in situ, but the capital costs associated with such a complex system would not appeal to a manufacturer.

Criteria 3) and 4) can be put to practice relatively easily for tank formation, since the electrodes are fully accessible for visual inspection throughout the formation. For container formation however, this method would require disassembly of cells and is therefore impractical.

Criterion 5) requires advanced equipment and time for sample analysis which are obvious obstacles for battery manufacturers. A chemical analysis method has been described that dissolves the entire positive electrode material in a solution, allowing for the percentage of $PbO_2$ in the formed electrode to be measured. This method could be used for evaluating formations as an iterative approach to determining benchmark formation requirements for each battery model produced by the manufacturer, however this method is applicable to measurement after the batteries have already completed, which is limited in applicability.

Criterion 6) is difficult to implement in practice as charge voltage of a battery is highly dependent on current, temperature, and electrolyte concentration, each of which may vary significantly even in the later stages of formation.

Aside from these six criteria, the default method used by some manufacturers for terminating formation is nothing more than a predetermined capacity or time limit based on generalized empirical algorithms. This method is simple and inexpensive to employ, but leaves much to be desired as it takes in no information specific to the ongoing formation that would indicate its completeness. A non-invasive method for confirming that the algorithm has successfully formed the battery to the desired level is to deep discharge cycle the battery and determine if the resulting output capacity meets specifications. However, this requires sampling batteries from every batch for testing and the test itself requires additional advanced testing equipment. Alternatively, invasive techniques can determine formation completeness by disassembling the formed battery and visually inspecting the electrodes, or by performing a more advanced chemical analysis to determine the exact electrode composition.

The LAB industry could benefit from a non-invasive method for monitoring the completeness of formation in situ. If a LAB manufacturer had access to such a method, they would be able to make any of the following findings regarding their formation strategies:
1. Existing strategies are not forming a given battery to an acceptable level and should therefore provide additional formation capacity in the factory in order to satisfy customer expectations.
2. Existing strategies are forming a given battery more than necessary and should therefore reduce formation capacity in the factory in order to save energy and time of manufacture.
3. New or experimental battery models can be formed optimally for a given application without conducting additional tests or assuming existing generalized algorithms can be applied.

SUMMARY

Among other things, methods, apparatus, and systems for non-invasive, in situ measurement of battery resistance are described herein, which provide a measurable indicator of formation or charge completeness in real-time. These enable any given formation or charging process in an appropriate battery, such as a LAB, to be properly terminated regardless of the electrode properties and environmental conditions.

In general, in an aspect, a battery charging system connected to a power source for charging of one or more batteries is provided, each battery having a positive terminal and a negative terminal. The system includes a control module having a microprocessor and microprocessor-readable instruction code, the control module being electrically interposed between the power source and one or more output electrical components and controls flow of current and voltage to the output electrical components. Each output electrical component is electrically connected to the control module, one of the battery positive terminals of the one or more batteries, and its corresponding battery negative terminal, each forming a circuit between that component and its corresponding battery wherein there are one or more circuits. Sensors are also included that attach to each circuit, in which the sensors provide information at least indicative of resistance in the battery corresponding to that circuit to an analysis module, the analysis module having a microprocessor and microprocessor-readable analysis code; in which the analysis module computes rate of change of resistance and compares the rate to a completion criterion for each battery.

Implementations may include one or more of the following. The rate of change of resistance is over time. The rate of change of resistance is over charge energy. The rate of change of resistance is over charge ampere-hours. The control module halts battery charging for a given battery upon notice from the analysis module that the completion criterion is met. The control module and the analysis module constitute the same combined module, sharing a microprocessor that includes both instruction code and analysis code and allows for instantaneous notice as between control and analysis functions. The system also has one or more completion indicators, which may include any or all of visual, textual, and aural indicia. The completion indicator is activated once the completion criterion is met for any battery. Each completion indicator is activated once the completion criterion is met for its corresponding battery. The completion indicator is activated once the completion criterion is met for all batteries. The sensors provide information at least indicative of resistance in a given battery include a voltage sensor and a current sensor, and resistance is calculated using a resistance equation. Each voltage sensor is attached to each circuit between the corresponding positive battery terminal and negative battery terminal. Each current sensor is attached to each circuit between its corresponding battery and the output electrical component. Each current sensor is attached to each circuit between the corresponding negative battery terminal and the output electrical component. Each current sensor is attached to each circuit between the corresponding positive battery terminal and output electrical component. The sensors also have a temperature sensor, which may or may not be used to adjust calculated resistance.

Implementations may also include one or more of the following. The instruction code has one or more measurement methods. One measurement method is direct current (DC) current pulse, in which there is a step change in current. The DC current pulse is performed with reference to a reference current. The DC current pulse is a current increase that is proportional to the reference current, in which the current increase can be expressed as a percentage higher than the reference current. The DC current pulse is a current decrease that is proportional to the reference current, in which the current decrease can be expressed as a percentage lower than the reference current. The DC current pulse is less than about 300% higher than the reference current. The DC current pulse is less than about 200% higher than the reference current. The DC current pulse is less than about 100% higher than the reference current. The DC current pulse is less than about 75% higher than the reference current. The DC current pulse is less than about 50% higher. The DC current pulse is less than about 25% higher. The DC current pulse is less than about 10% higher. The DC current pulse is to zero current. The DC current pulse is less than 100% lower than the reference current. The DC current pulse is less than about 75% lower. The DC current pulse is less than about 50% lower. The DC current pulse is less than about 25% lower. The DC current pulse is less than about 10% lower. The DC current pulse has a preselected time-based duration. The duration is greater than about 300 seconds. The duration is about 300 seconds. The duration is between about 60 seconds and about 300 seconds. The duration is about 60 seconds. The duration is between about 30 seconds and about 60 seconds. The duration is about 30 seconds. The duration is between about 15 seconds and about 30 seconds. The duration is about 15 seconds. The duration is between about 1 second and about 15 seconds. The duration is about 1 second. The duration is less than about 1 second. The duration is about 1 millisecond. One measurement method is alternating current (AC) current injection. The AC current injection has a frequency between about 1 Hz to about 10 kHz. The frequency is about 1 kHz. The AC current injection has a current amplitude between about 1 microampere to about 10 ampere, optionally about 100 milliampere.

Implementations may also include one or more of the following. The control module has instruction code to perform one or more measurement methods during a measurement interval for each battery. The control module has instruction code to perform a plurality of measurement intervals in a sequence for each battery. The measurement intervals within the sequence include varying measurement methods. The sequence is periodic. The sequence is about every 10 minutes. The sequence is about every 30 minutes. The sequence is about every hour. The sequence is about every five hours. The sequence is not periodic but is performed according to a predetermined schedule. The predetermined schedule is first sixty minutes, second ten minutes, and every five minutes thereafter until halted.

Implementations may also include one or more of the following. The analysis module has analysis code to perform a calculation of resistance using the voltage sensor and the current sensor for each measurement method. The measurement method is DC current pulse. The measurement method is AC current injection. The analysis module has analysis code to combine results of the one or more measurement methods performed during each measurement interval, optionally where the results are combined by averaging. The analysis module has analysis code to compute rate of change of resistance using at least two measurement intervals in the sequence. The analysis module has analysis code to compute rate of change of resistance using a rate of change of resistance equation, and to compare to the completion criterion, either where the rate of change is computed over time or where the rate of change is computed over charge ampere-hours or where the rate of change is computed over charge energy. The analysis module has analysis code to compute the moving average of adjacent intervals in the sequence of calculations of rate of change of resistance. There are at least five measurement intervals used to compute the rate of change of resistance. There are at least three measurement intervals used to compute the rate of change of resistance. The number of measurement intervals used to compute the rate of change of resistance is preselected to result in the completion criterion being met when the given battery is charged to between about 80% and about 95% of complete charge. The number of measurement intervals used to compute the rate of change of resistance is preselected to result in the completion criterion being met when the given battery is charged to between about 90% and about 100% of complete charge. The analysis module has analysis code to compute a plurality of rates of change of resistance over a corresponding plurality of sequences. The completion criterion is met when the computed rates of change of resistance asymptotically approach zero. The completion criterion is met when the computed rates of change of resistance reach zero.

In general, in an aspect, a method of charging a battery is described, the method including charging of a battery using the one of the systems described herein.

In general, in an aspect, a method of charging a battery is described, the method including using the instruction code and analysis code described herein upon a microprocessor in a battery charging system.

In general, in an aspect, a method of detecting complete formation of a battery cell is described, the method comprising applying a technique selected from AC current injection, DC current pulse-up, DC current pulse-down, and DC current pulse-to-rest to determine resistance, wherein the DC resistance is measured for a period between about 1 sec and about 300 see, or for a period of about 1 millisecond; and detecting that formation is complete when the calculated rate of change of the measured resistance reaches a predetermined value.

These and other features and aspects, and combinations of them, may be expressed as methods, systems, components, means and steps for performing functions, apparatus, articles of manufacture, computer-readable instructions, compositions of matter, and in other ways.

DESCRIPTION

PARTS LEGEND

Figure 1:
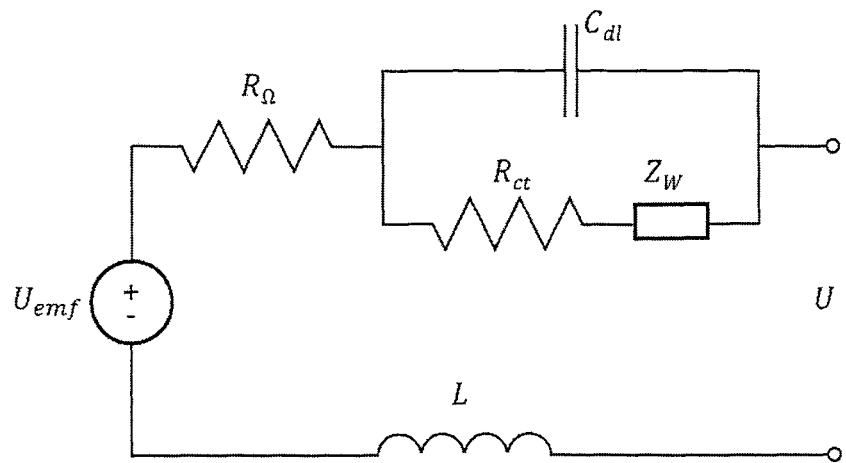
FIG. 1 shows a Randles model representing a battery.

101 Battery charging system
103 Power source
105 Battery
107 Positive terminal of the battery
109 Negative terminal of the battery
111 Control module
113 Control module microprocessor
115 Output electrical component
117 Sensors
119 Voltage sensor
121 Current sensor
123 Temperature sensor
125 Completion indicator
127 Analysis module
129 Analysis module microprocessor
131 Analysis code
133 Instruction code Measurement of battery resistance as described herein is hereby disclosed as an indicator of termination for LAB formation. Resistance trends have been established in a series of laboratory-based simulations of battery cell formation. These trends have then been correlated with formation completeness, such that a battery manufacturer would be able to determine a suitable termination point for the formation process associated with these trends. The method has been verified for large-scale battery production through additional experimentation in a lead-acid battery manufacturing facility.

In some embodiments, a method measures resistance of a battery cell using AC current injection. In some embodiments, a method measures resistance using DC current pulse. In some embodiments, a method measures resistance of a battery cell using DC pulse-to-rest, in which a DC current pulse is halted temporarily such that the current is zero during the pulse. In some embodiments, a method measures resistance of a battery cell using DC pulse-up, in which a DC current pulse is applied to a reference DC current such that the current is temporarily higher. In some embodiments, a method measures resistance of a battery cell using DC pulse-down, in which a DC current pulse is applied to a reference DC current such that the current is temporarily lower. In some embodiments, a method combines two or more current pulses taken in succession (e.g., by averaging) in order to reduce noise in measurement. In some embodiments, a method measures resistance of a battery cell using a plurality of the foregoing measurements. The application of one of the foregoing techniques and concomitant measurement of resistance takes place over a measurement interval (period) between about 1 sec and about 60 sec, or between about 5 sec and about 30 sec, or between about 8 sec and about 12 sec. By measuring resistance on one of the foregoing timescales, sufficient change in resistance is measured so as to identify whether the rate of change of resistance has reached a predetermined value. In a preferred embodiment, the predetermined value is when rate of change in resistance approaches zero.

Lead-Acid Batteries

During the formation/charge of a LAB, electrochemically inactive materials in the electrodes are converted into electrochemically active ones. This means that in general, as the battery undergoes formation/charge its electrical conductivity improves, and the electrochemical reaction kinetics evolve with the changing electrode composition. The electrical conductivity and reaction kinetics determine the resistance of the battery, so it follows then that the trending resistance may display unique characteristics when the formation/charge is complete. These resistance trends can be measured at any point during a formation/charge by superimposing electrical current transients over the constant formation/charge current and measuring the corresponding electrical voltage response.

Ohmic losses are voltage drops that occur strictly due to Ohm's law, which states that the voltage drop across a resistive element will be directly proportional to the magnitude of the current flowing through it. All of the metallic components in a LAB will have some resistance to electron flow, including the current collectors, as well as the electrode materials themselves, which must conduct electrons to the reaction site at the electrode-electrolyte interface. While the grid, welds, and tabs will have a fixed electrical resistance for a given battery (barring large temperature fluctuations or corrosion with age), the resistance of the electrode materials will be a function of a battery's state of charge (SoC), which increases during formation/charge. The activation overpotential is the extra potential above or below the equilibrium potential that is required to drive the electrochemical reactions in order to achieve a certain current. The charge-transfer current obtained from a given overpotential is described by the Butler-Volmer equation:

$$I = i_0 A \left[ e^{\alpha \frac{nF}{RT} \eta} - e^{-(1-\alpha)\frac{nF}{RT}\eta} \right] \quad (1)$$

where
I is the charge-transfer current
$i_0$ is the exchange current density of the reaction
A is the area of the reaction surface
$\alpha$ is the charge transfer coefficient of the reaction
R is the universal gas constant T is the absolute temperature
F is Faraday constant
n is the number of electrons transferred in the reaction
$\eta$ is the activation overpotential The exchange current represents the rate at which oxidation and reduction proceed in equilibrium with no net current. It is itself a function of temperature, reactant concentration, and the electrode system in question. Eq. (1) also illustrates how a larger overpotential is required to obtain the same current when the reacting surface area of the electrode is smaller. This influence is manifested in practice when electrode dimensions limit current capability and also when the remaining active area available for reaction in a given electrode changes as it is discharged or charged. Eq. (1) shows that charge-transfer increases exponentially with overpotential.

As with most batteries, LABs will undergo side reactions above a certain overpotential threshold. While there are a number of these reactions, the most significant by far is water electrolysis. Just as the main reactions of the positive and negative electrodes adhere to the Butler-Volmer relationship, so do the side reactions. Relatively large overpotentials are required for electrolysis to proceed at a significant rate in a LAB, and this typically occurs above 2.50 volts per cell for flooded types.

When $O_2$ and $H_2$ gases are evolved at a significant rate, the amount of water in the electrolyte decreases, leading to a decline in total electrolyte volume and an increase in electrolyte concentration. This means that long term operation of LABs requires periodic water replenishment, at least in the case of flooded/vented cells. In contrast to flooded LABs, sealed valve-regulated lead-acid (VRLA) batteries are maintenance-free. These designs allow for the transport of evolved $O_2$ gas to the negative electrode, where it is reduced to form water, such that water loss is strongly inhibited.

Formation

When a LAB is first manufactured, the electrodes are electrochemically inactive plates. In order to make the battery useful as an energy storage device the manufacturer must subject it to its first charge, which is known as formation.

Electrodes for LABs are made by applying a wet paste onto lead grids. The wet pasted plates are then treated with a curing process before continuing down one of two paths in the manufacturing process:

1) Tank formation: individual cured plates are assembled into large tanks of $H_2SO_4$ electrolyte and charged. The charged plates are then cleaned, dried, and stored as individual plates which can be assembled into containers at a later date before being sold and shipped. Electrolyte is then added to the cells by a local distributor.
2) Container formation: individual cured plates are assembled into containers to make unformed cells which are then filled with $H_2SO_4$ electrolyte. The assembled and filled cells are then subjected to the formation charge and are ready to be sold.

The formation process itself involves a soaking period (no more than a few hours) in which the cured plates sit in the electrolyte at open circuit, followed by the actual electrical charging process (up to several days) which electrochemically activates the paste material into charged positive and negative plates. During the soak, the $H_2SO_4$ reacts with the PbO and basic lead sulfates of the cured paste, producing $PbSO_4$. This reaction is exothermic, so the temperature rises significantly before the formation current is even initiated.

Once the formation itself begins, the plates that give up electrons will oxidize to form positive electrodes, while the plates that gain electrons will reduce to form negative electrodes. The formation of a LAB takes place in two stages, where the first stage is characterized by low voltage and electrolyte concentration, and the second stage is characterized by high voltage and electrolyte concentration.

The theoretical capacity (TC) of a LAB is the amount of charge that would be required to form the battery if every electron transferred resulted in the conversion of PbO to dischargeable PbO$_2$ in the PAM and dischargeable Pb in the NAM. Since two electrons are transferred for every PbO molecule, and the atomic mass of PbO is known, the Faraday constant enables the calculation of the TC:

$$\frac{96485 \, A \cdot sec}{1 \, mol \, e^-} * \frac{1 \, hr}{3600 \, sec} * \frac{2 \, mol \, e^-}{0.2232 \, kg \, of \, PbO} = 240 \frac{Ah}{kg \, of \, PbO} \quad (2)$$

In practice, this can be applied by measuring the mass of the grids before pasting, and after pasting and curing:

TC=(Total Electrode Mass−Grid Mass−Water Mass)
*240 (3)

Because much of the applied charge will convert PbO to non-dischargeable electrode structures in the first stage of formation, and also electrolyze water throughout the formation, the formation efficiency is less than 100% and the actual capacity required to completely form the battery will be greater than the TC. The required formation capacity will depend on the plate thickness, the paste composition, and the formation current, and can be more than double or triple the TC.

Battery Resistance

There are a wide range of equivalent circuit models used in literature to represent the working voltage of a battery, U. Perhaps the most well-known of these circuits is the Randles model, shown in FIG. 1. This circuit models the electromotive force (U$_{emf}$) of the battery as an ideal voltage source, which provides the unloaded voltage of the battery in equilibrium. The ohmic resistance of the metallic components as well as the electrolyte and separator are modelled as the series resistor, R$_\Omega$; the charge-transfer resistance for activation polarization across the electrochemical double-layer (EDL) is modelled as the parallel resistor, R$_{ct}$; the parallel capacitor, C$_{dl}$, is used to model the capacitance of the EDL; the high-frequency inductance of the metallic components is modelled by the series inductor, L; the Warburg impedance, Z$_W$, is a constant phase element and is the simplest method for modelling mass transport effects.

The Randles model serves reasonably well for qualitatively describing equilibrium and non-equilibrium conditions of a battery. For precise modelling of battery behaviour however, this model has significant shortcomings. The theory presented previously makes it clear that the parameters of the Randles model will not remain constant during operation. U$_{emf}$ and R$_\Omega$ are dependent on SoC, and R$_{ct}$ is dependent on a number of variables based on the Butler-Volmer equation. Furthermore, the negative and positive electrodes will have their own individual variations for each parameter, which make the lumped parameters of the Randles model even less representative of a physical cell.

Figure 2:
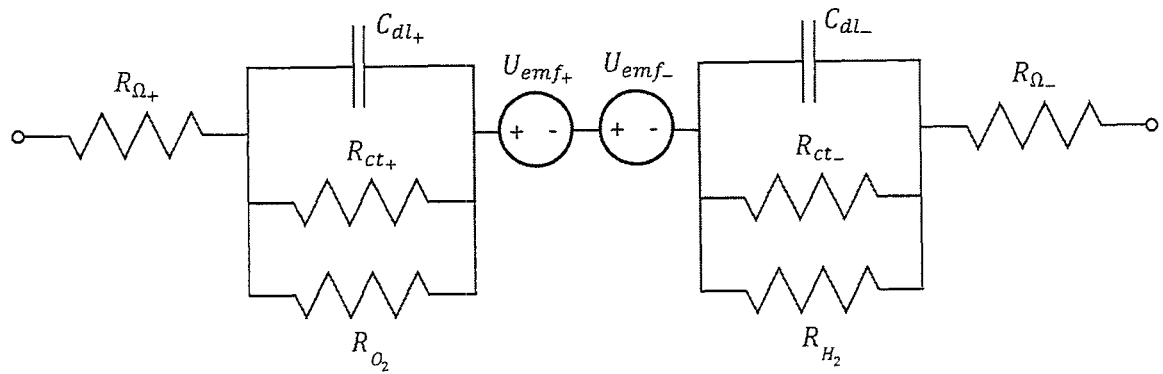
FIG. 2 shows a LAB equivalent circuit accounting for electrolysis side reactions.

In order to account for side reactions during charging at high SoC, modifications must be made to the Randles model, such as that shown in FIG. 2. This model illustrates how the current at both electrodes (+ and −) will be shared between the gassing reactions and the main charge-transfer reactions, depending on their relative reaction resistances.

One widely used experimental technique in the research of battery characteristics is electrochemical impedance spectroscopy. This method involves injecting low-amplitude alternating current (AC) into the battery at a wide range of frequencies (typically millihertz to megahertz) and measuring the corresponding AC voltage response and phase angle. The battery impedance as a function of frequency can then be calculated. For LABs, a frequency of 1000 Hz is often used to isolate the ohmic resistance of the battery.

Figure 3:
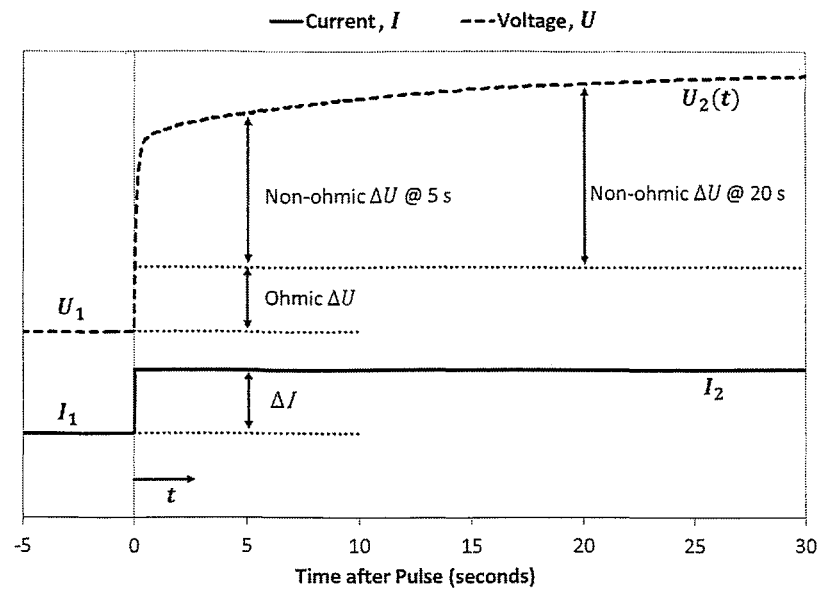
FIG. 3 shows an example of a current pulse and voltage response.

Direct current (DC) pulsing involves a sudden, temporary change in the charging current or discharging current of a battery. The effective resistance of the battery can then be calculated from the voltage change that results from the current change. An important consideration is that the duration of the pulse will influence the measured resistance. For a given current pulse, in general the longer the pulse the greater the measured voltage change (and thus the calculated resistance) will be. The ohmic response will occur instantaneously, while the non-ohmic response will occur gradually over time as the EDL charges or discharges towards a new equilibrium voltage. This is shown in FIG. 3. Due to the non-linearity of Butler-Volmer, the measured resistance will also depend on the magnitudes of both the pre-pulse current and the pulse current.

For a current pulse such as that shown in FIG. 3 the resistance can be calculated as shown in Eq. (4):

$$R_t = \frac{U_2(t) - U_1}{I_2 - I_1} \quad (4)$$

where
t is the duration of the pulse
R$_t$ is the battery resistance at time t
U$_1$ is the voltage immediately before the pulse
U$_2$(t) is the voltage during the pulse, which is a function of time t
I$_1$ is the base current or pre-pulse current
I$_2$ is the pulse current In some embodiments, the methods described herein can be implemented as software or firmware to be run upon previously installed battery charging systems, such as in a factory. In some embodiments, a box containing an analysis module and having connections to the previously installed power source, control module, output electrical component, and/or completion indicator is supplied to perform the methods described herein.

Further description as to various method, apparatus, and system embodiments is given below with reference to experimental data supporting their utility. Additional color figures and photographs illustrative of embodiments of the invention are found in U.S. Provisional Patent Application Ser. No. 62/204,741.

Figure 4A:
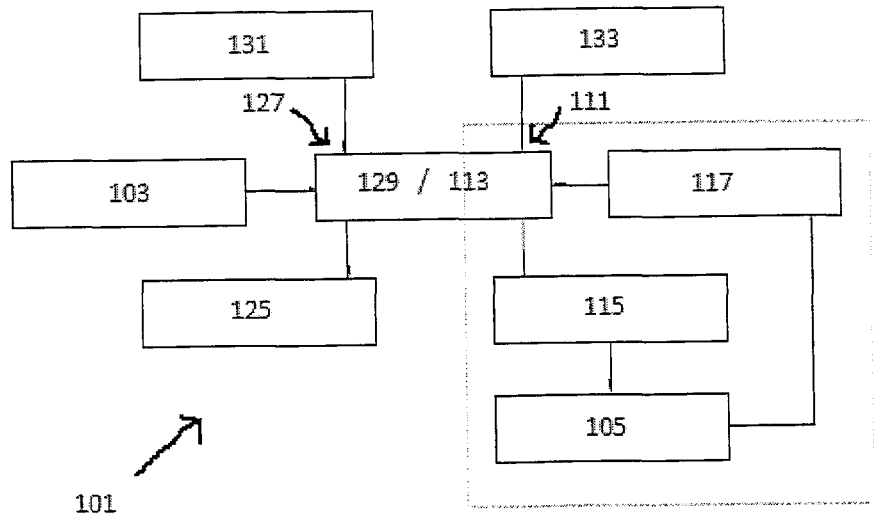
FIG. 4 shows a diagram of a battery charging system (dashed area of 4A depicted as a zoomed-in view at 4B).
Figure 4B:
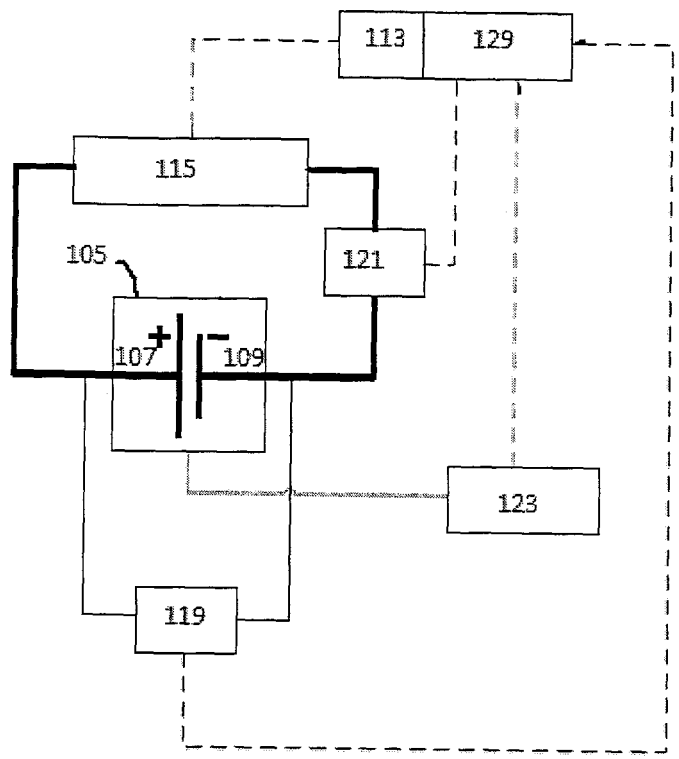
Figure 9:
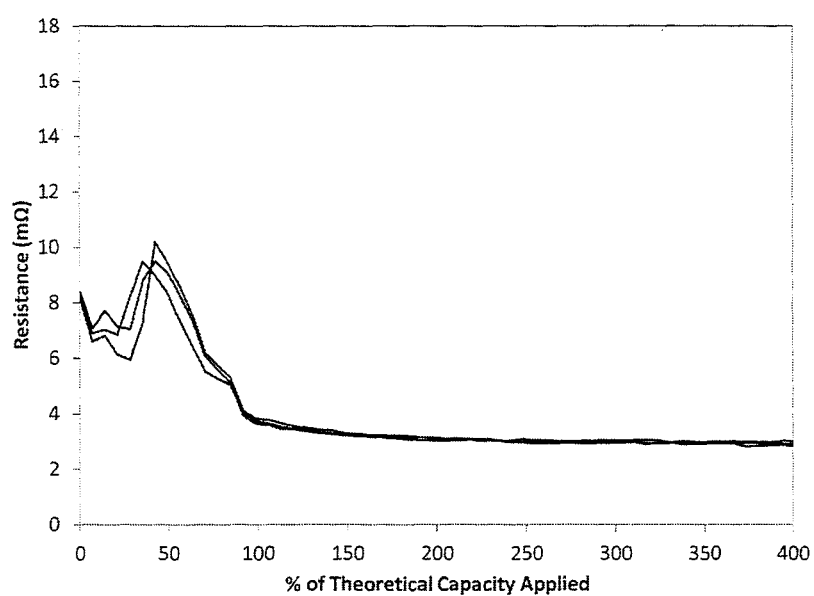
FIG. 9 shows resistance of three cells for a pulse-up DC current pulse over % theoretical capacity applied. (cell set A)

FIG. 4A and FIG. 4B provide a functional diagram of a battery charging system illustrative of apparatus embodying the methods described herein. A battery charging system 101 has a power source 103 that provides a source of electricity for charging/formation as well as to power components of the system. The power source is connected to the analysis module 127 and to the control module 111, each of which is controlled by their respective microprocessors 129 and 113. In some embodiments and as depicted in FIG. 9, these modules are encoded onto the same electronic component such that the microprocessor 129 and the microprocessor 113 are the same device running different instructions as required for operation. The analysis module 127 is programmed by microprocessor-readable analysis code 131, supplied by software, firmware, or by other methods known in the art. The control module 111 is programmed by microprocessor-readable instruction code 133, supplied by software, firmware, or by other methods known in the art. The control module 111 is electrically connected to the output electrical component 115 such that it is interposed between the power source 103 and the output electrical component 115 and can control current and voltage flowing to a battery 105. These may in some embodiments be enclosed in an enclosure (not shown) that has a plurality of ports allowing for connection of sensors, mains power, and interconnects between the output electrical component 115, the positive terminal 107 and negative terminal 109 of the battery 105. In some embodiments, there is a plurality of output electrical component "channels" and ports for sensors 117 that are separately controllable by the control module 111 and analyzable by the analysis module 127 for charging of a plurality of batteries 105; or in some embodiments, controlled by a plurality of control modules corresponding to each channel. These channels provide for individual addressing of the charging process for a given battery. In some embodiments, there is only one channel for use with a single battery.

Sensors 117 are connected to each battery such that at least resistance can be determined. In some embodiments, resistance is determined by use of a voltage sensor 119 and a current sensor 121, applying a resistance equation such as one of those discussed above. In some embodiments, the sensors 117 also have a temperature sensor 123. In some embodiments the temperature sensor 123 is connected to the external wall. In some embodiments the temperature sensor 123 feeds its output to the analysis module 127 by means of a port on the enclosure. In some embodiments the voltage sensor 119 feeds its output to the analysis module 127 by means of a port on the enclosure. In some embodiments the current sensor 121 feeds its output to the analysis module 127 by means of a port on the enclosure.

Each battery 105 has a positive terminal 107 and a negative terminal 109, and the system 101 supplies charge to each battery during, e.g., formation by attaching the output electrical component 115 that corresponds to that battery to its battery terminals 107 and 109. Control of the current and voltage is accomplished by the control module 111 via its microprocessor 113 and associated electronics. The sensors 117 connect to each circuit formed between the output electrical component 115 and each battery 105 (via its terminals). In some embodiments, a current sensor 121 is connected to each circuit between the component 115 and the negative terminal 109, or alternatively between the component 115 and the positive terminal 107; the sensor 121 then sends current information to the analysis module 127 via its microprocessor 129 and associated electronics. In some embodiments, a temperature sensor 123 is connected to each battery 105 at a position considered indicative of the battery's temperature; the sensor 123 then sends temperature information to the analysis module 127 via its microprocessor 129 and associated electronics. In some embodiments, a voltage sensor 119 is connected between the positive terminal 107 and the negative terminal 109; the sensor 119 then sends voltage information to the analysis module 127 via its microprocessor 129 and associated electronics. In some embodiments, resistance is calculated within the analysis module 127 using a resistance equation and the current and voltage information provided to the module. In some embodiments, resistance is calculated within the analysis module 127 using a rate of change of resistance equation and the current and voltage information provided to the module. In some embodiments, calculated resistance is adjusted with respect to information provided by the corresponding temperature sensor. In some embodiments, the temperature sensor is for monitoring purposes and is not used to adjust calculated resistance.

In some embodiments, the instruction code has a measurement method. In some embodiments, the instruction code has one or more measurement methods. In some embodiments, the control module has instruction code to perform one or more measurement methods during a measurement interval for each battery, for analysis by the analysis module. A measurement interval can include the results of one or more measurement methods, which may be the same method or different methods. In some embodiments, the analysis module uses the results of the measurement method as its own measurement interval. In some embodiments, the analysis module has analysis code to combine (for example, by averaging) the results of measurement methods within the measurement interval.

In some embodiments, one of the measurement methods is DC current pulse, in which there is a step change in current. DC current pulse can be performed with reference to a reference current, such that the DC current applied during pulsing can be expressed as a percentage higher or lower than the reference current. In some embodiments, the DC current pulse can be less than about 300% higher, or less than about 200% higher, or less than about 100% higher, or less than about 75% higher, or less than about 50% higher, or less than about 25% higher, or less than about 10% higher than the reference current. In some embodiments, the DC current pulse can be less than about 100% lower, or less than about 50% lower, or less than about 25% lower, or less than about 10% lower than the reference current. In some embodiments, the DC current pulse is to zero current.

In some embodiments, the DC current pulse has a duration that is time-based and preselected based on the battery design, size, capacity, or application. In some embodiments, the duration is greater than about 300 seconds, or about 300 seconds, or between about 300 and about 60 seconds, or about 60 seconds, or between about 60 seconds and 30 seconds, or about 30 seconds, or between about 30 seconds and about 15 seconds, or about 15 seconds, or between about 15 seconds and about 1 second, or about 1 second, or less than about 1 second, or about 1 millisecond. "About" in the context of time is intended to mean a duration that has similar performance when compared to the named time; about 1 millisecond would not include, for example, 1 second but about 1 second would include, for example, 2 seconds.

In some embodiments, one of the measurement methods is AC current injection. In some embodiments, the AC current injection has a frequency between about 1 Hz to about 10 kHz. In some embodiments, the frequency is about 1 kHz. In some embodiments, the AC current injection has a current amplitude between about 1 microampere to about 10 ampere. In some embodiments, the current amplitude is about 100 milliampere.

In some embodiments, the analysis module has analysis code to compute rate of change of resistance using a rate of change of resistance equation and to compare to the completion criterion; this rate of change of resistance can be, according to the desired computation, over time, charge ampere-hours, or charge energy. In some embodiments, the analysis module has analysis code to compute rate of change of resistance using at least two measurement intervals in a sequence. A sequence includes one or more measurement intervals. In some embodiments, the control module has instruction code to perform a plurality of measurement intervals in the sequence, which may be, but need not be identical to a previous performed sequence. In some embodiments, the sequence repeats on a regular or periodic basis, such as about every 10 minutes, about every 30 minutes, about every hour, or about every five hours. In some embodiments the sequence is performed according to a predetermined schedule. One example of a predetermined schedule is to perform the sequence every sixty minutes after beginning charging, then to perform the sequence every ten minutes during mid-charge, and then to perform the sequence every five minutes until the completion criterion is met. Predetermined schedules can be encoded within the control module on the basis of a given application or use case for the battery charging system and selected based on that application or use case (for example, in order to reduce the number of sequences performed during early charge, or to increase the number of sequences performed when the rates of change of resistance approach zero).

In some embodiments, the analysis module has analysis code to compute the moving average of adjacent measurement intervals within the sequence, to compute the rate of change of resistance. In some embodiments, the analysis module has analysis code to compute several rates of change of resistance across sequences. In some embodiments, the rate of change of resistance is computed using at least three, or at least five measurement intervals. In some embodiments, the number of measurement intervals (or sequences of measurement intervals) used to determine rate of change of resistance is preselected to result in the completion criterion being met for a given battery when it is charged to between about 80% and about 95% of complete charge, or when it is charged to between about 90% and about 100% of complete charge. As has been discussed herein, there are use cases in battery charging for which approximately complete charge is optimal, and there are use cases in battery charging for which less than complete charge is optimal; and preselecting the number of measurement intervals and/or sequences for a given use case (and battery size, capacity, etc.) allows for adjustment of noise in the rate of change in resistance trend on approaching zero; and this in effect increases the number of early zero rates of change in resistance (preselect for more noise) or decreases the number of early zero rates of change in resistance (preselect for less noise); resulting in a system that reports the completion criterion is met at the appropriate charge level.

In some embodiments, the analysis module 127 signals the control module 111 to halt charging of the battery 105 once it has reached a completion criterion. In a preferred embodiment, the completion criterion is met when the rate of change of resistance (over time or charge energy or charge ampere-hours) asymptotically approaches zero. In some embodiments, the completion criterion is met when the rate of change of resistance reaches zero. In some embodiments, the rate of change of resistance is computed several times to determine whether the completion criterion has been met. In some embodiments, the analysis module has analysis code to compute a plurality of rates of change of resistance over a corresponding plurality of sequences and to determine whether these computed rates of change of resistance asymptotically approach zero (in other words, whether the rate of change of resistance is asymptotically approaching zero).

In some embodiments, once the completion criterion is met and charging has halted for a given battery, a completion indicator 125 is activated. In some embodiments, the indicator 125 has at least a visual aspect. In some embodiments, the indicator 125 displays text indicating charging is complete. In some embodiments, the indicator 125 has at least an aural aspect, such as an alarm. In some embodiments, there are a plurality of completion indicators that correspond to the channel that has completed charging.

EXAMPLES

A series of experiments were designed and conducted in order to investigate the potential for resistance measurements to indicate the completeness of a LAB formation. A manufacturer provided unfilled, unformed LABs for testing, as well as $H_2SO_4$ electrolyte for filling the cells prior to formation. All tests were conducted on flooded, vented cells due to their availability and simplicity, including the different sets listed in Table 1 with the calculated TCs of each electrode. The TCs are calculated from sensitive data provided in confidence by the manufacturer. For all cells the PAM has a larger TC, indicating more paste mass on this electrode.

TABLE 1

LAB test cells

| Cell set | Manufacturer model | Quantity tested | PAM TC (Ah) | NAM TC (Ah) |
|---|---|---|---|---|
| A | S | 3 | 710 | 535 |
| B | S | 7 | 710 | 535 |
| C | CS | 7 | 1165 | 1043 |

Note that set A and set B are the same model with the exception that the A cells were preassembled into a 6 V module consisting of three cells in series. Both set B and set C came from the manufacturer as individual 2 V cells. The reason for testing two different models is to verify that any findings regarding resistance apply to more than one cell design, as set C has thicker electrodes than sets A and B.

A power-cycler was used to form, discharge, and charge the cells while logging measurements of current, voltage, cell temperature, and ambient temperature. The power-cycler was able to log the voltages of positive and negative half-cells through use of a mercury/mercurous sulfate (Hg/$Hg_2SO_4$) reference electrode placed into select cells. The programmable cycling schedules of the power-cycler enabled a variety of precise DC pulsing strategies to be employed for resistance measurements during formations. Aside from these pulsing strategies, a hand-held battery analyzer was also used to collect resistance data through AC injection. Throughout formation and subsequent cycling, the specific gravity (SG) and temperature of the bulk electrolyte at the top of the cells were measured using a digital portable density meter. Finally, digital multimeters were used to verify the measurements being recorded by the power-cycler.

See FIG. 9 for the setup for a test cell undergoing formation in the laboratory. Current cables and voltage probes were connected to the terminals of the batteries using brass nuts and bolts for low electrical resistance. External wall temperature probes consist of T-type thermocouples secured to the cell casing with insulating tape.

Only container-formations of pre-assembled cells were performed in this study, due to the complexities and safety concerns associated with the alternative tank formation method. Once all measurement systems were connected and data logging had begun, test cells were filled with 1.200 SG electrolyte to begin the soaking process. Simple strategies were employed with regard to the base current (as opposed to the pulse current) used during formations, although lower initial base currents were used at the start of formation to mitigate high soaking temperatures in excess of 50° C. Table 2 lists the current steps used for each cell set.

TABLE 2

Steps in base current used during formations

| Cell set | Step 1 | Step 2 | Step 3 | Step 4 |
|---|---|---|---|---|
| A | 20 A for 1 hour | 10 A for 6 hours | 20 A for 235 hours | N/A |
| B | 10 A for 2 hours | 20 A for 21 hours | 30 A for 24 hours | 40 A for ≤72 hours |
| C | 20 A for 3 hours | 30 A for 2 hours | 40 A for 2 hours | 50 A for ≤94 hours |

In some tests single cells were set up on their own channel, while in other cases several cells were connected in series on the same channel. In the latter case, individual cells were sequentially removed from the string after a predetermined formation capacity had been applied. In this way, the resistance during formation and discharge capacity after formation can be compared for a range of formation inputs.

Throughout formation, the power-cycler software logged current, voltage, cell temperature, and ambient temperature every 6 seconds. This logging speed was increased during the pulses. Cells formed to higher levels underwent extensive electrolysis, leading to substantial depletion of the electrolyte volume inside the cells. To prevent the electrolyte level from falling below the top of the plates, replacement water was added to the cells as necessary. After each cell was formed it was topped up with 1.265 SG electrolyte as recommended by the manufacturer.

AC injection was accomplished with a Fluke BT510 battery analyzer. Like many handheld battery resistance meters, the BT510 injects AC current into the battery at a single frequency of 1000 Hz as opposed to electrochemical impedance spectroscopy which injects a wide range of frequencies. The single frequency is intended to be high enough that the EDL will not respond enough to contribute to the measured voltage response, but not so high as to pick up on inductive effects in the metallic components (analogous to shorting the parallel capacitor in the equivalent circuit). In this way, only the ohmic resistance of the metals, electrolyte, and separator should be measured.

The power-cycler also has a built-in function for measuring ohmic battery resistance. The function imposes 10 rapid back-to-back current pulses and averages the calculated values, where one "pulse" consists of a pulse-up, return, pulse-down, return. Although data logging only occurs every 16 milliseconds, this built-in function can employ pulse durations as short as 1 millisecond. A duration of 1 millisecond was chosen so as to reflect the 1000 Hz frequency of the AC injection.

In order to measure more than just the ohmic resistance, the base formation current was pulsed briefly throughout the formation. Pulses were scheduled to occur every 50 Ah of formation and were held for 10 seconds. Since it is possible to pulse up or down from the base current, both methods were employed during the first experiment, which was conducted on cell set A. Only upward pulses were employed for the formations of cell sets B and C.

TABLE 3

Pulsing strategies applied during formation

| Cell Set | Base Current (A) | Pulse Up (A) | Pulse Down |
|---|---|---|---|
| A | 10, 20 | Base + 20 | Base − 10 |
| B | 10, 20, 30, 40 | Base to 60 | N/A |
| C | 20, 30, 40, 50 | Base + 30 | N/A |

After examining the results of the set B formation, a modification was made to the pulsing strategy for the set C formation. In order to improve the smoothness of the observed resistance trends, three back-to-back pulses were used for every interval in the formation, allowing for averaging of the individual pulses. The period between pulses was set to be as long as the pulse duration to allow the voltage transients to dissipate before the next pulse.

The resistance was calculated from the measured currents and voltages associated with the pulse, using Eq. (4). Once resistance values were obtained, a technique was employed to evaluate how the resistance was changing throughout the formation. This technique is referred to as the resistance rate of change (RRoC).

$$RRoC_j = \frac{R_j - R_{j-x}}{Q_j - Q_{j-x}} \tag{5}$$

where
j is the integer referring to the pulse interval, ≥2
R is the resistance
Q is the formation capacity
RRoC is the rate of change of resistance
x is the number of resistance measurement intervals over which RRoC is to be calculated In order to evaluate the available capacity in each cell provided by formation, the cells were subjected to discharge tests. After cells had been formed and topped up with 1.265 SG electrolyte, they were left to rest for at least 12 hours such that their temperatures could return to an ambient level. Using the same power-cycler and experimental setup used in formation, a constant C/4 current was then drawn from each cell until its voltage fell to a set limit, after which point the cell rested again. For such an application it is common practice to set the voltage limit to 1.75 V per cell on discharge, as the rate of voltage decline usually becomes exponential near this point. The discharged capacity at the time this limit was reached was recorded for each cell. Since cells formed to higher levels should take longer to reach the discharge voltage limit, cells could not be arranged in series on discharge as they had been during formation. Each cell was discharged individually on its own channel.

The discharge capacity for a given cell and current will increase with temperature, as higher temperatures improve the conductivity and reaction kinetics of the cell. Therefore, in order to properly compare the capacities discharged from the cells in this study, a temperature correction had to be taken into the analysis:

$$D_r = \frac{D}{1+\lambda(T_1 - T_r)} \quad (6)$$

where $T_r$ is the desired reference temperature, taken as 25° C. for this study D is the measured discharge capacity before correction $D_r$ is the discharge capacity corrected to reference temperature $T_r$ $T_1$ is the measured temperature at the start of the discharge $\lambda$ is a constant given as 0.006 K$^{-1}$ for currents slower than C/3 (this study) and 0.01 K$^{-1}$ otherwise Thus all discharge capacities are corrected to 25° C. for proper comparison. In order to minimize errors introduced by the correction, cell temperatures were kept within 2° C. of the reference temperature before discharging.

Figure 5:
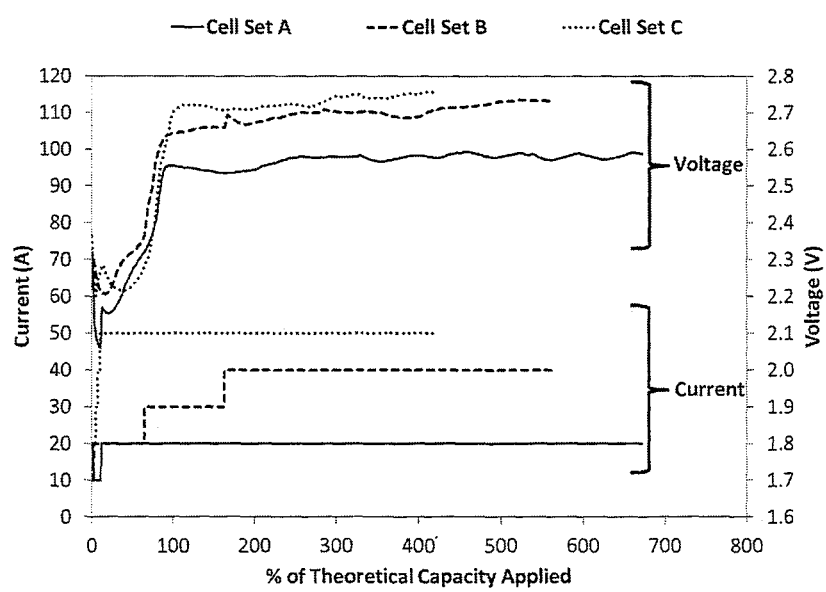
FIG. 5 shows voltage and current during formation for several test cells.

The cell voltages obtained from each formation method are shown in FIG. 5 with the corresponding currents. Note that for visual convenience the many pulses that were applied during each formation are not shown in these trends.

Figure 6:
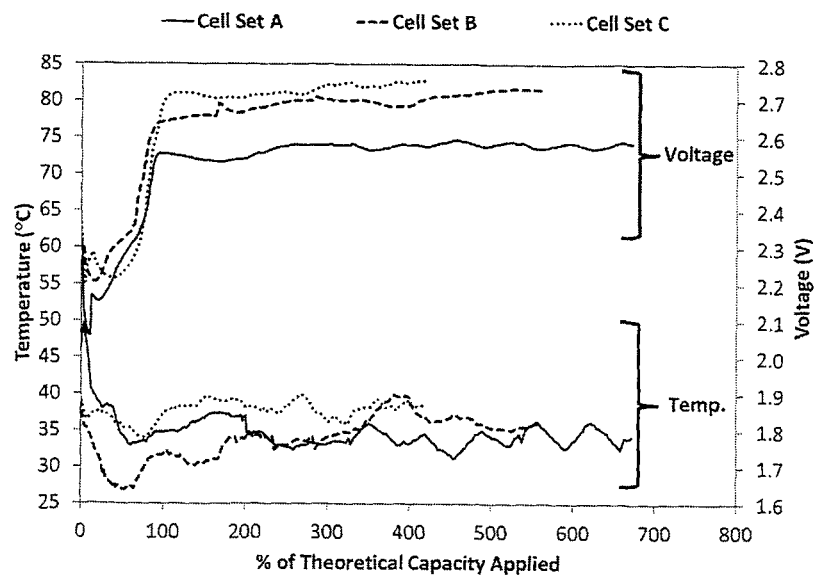
FIG. 6 shows temperature and voltage during formation for several test cells.

To make a more level comparison of the different cell sizes, the abscissae was scaled to the size of each cell. This is done using the PAM TC, which as the larger of the two electrode TCs can be treated as the TC of the full cell. FIG. 6 also shows the temperatures during the different formation techniques. Clearly, larger currents and voltages give rise to higher temperatures, as would be expected from Joule heating. The reverse influence of temperature on voltage is also obvious at higher formation levels, as otherwise-smooth voltage trends undergo small oscillations inverse to the cell temperature oscillations which occur on a daily cycle (due to ambient temperature variations).

In order to evaluate the ohmic component of the battery impedance throughout formation, fast-response results will first be examined. These results include AC injection and the built-in DC resistance-measuring function of the power-cycler. During formation, the inactive nonconductive materials in the electrodes are being converted to conductive materials. At the same time, the electrolyte concentration (and thus, its conductivity) should reach a minimum in the early stages before increasing thereafter, and this was observed through manual SG measurements as described previously. This means that the changing contributions of the electronic and ionic resistance to the overall ohmic resistance should oppose each other in the early stages of formation, but then combine constructively to decrease the ohmic resistance thereafter.

Figure 7:
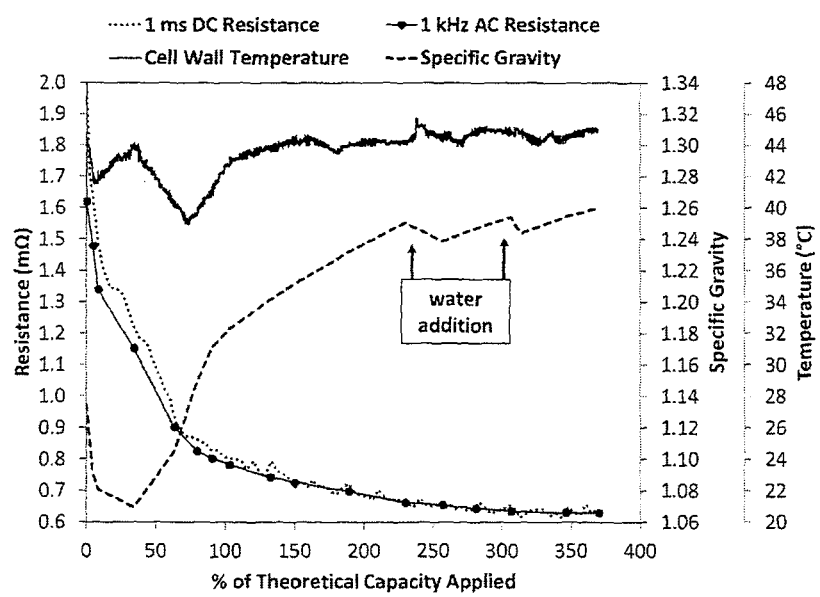
FIG. 7 shows temperature over % theoretical capacity applied as well as electrolyte specific gravity and resistance for fast-response methods (AC injection, DC pulse train). (cell set C)

The first task is to compare the resistance measurements throughout formation given by the 1000 Hz AC injections with those given by the built-in function running 1 millisecond pulses, as shown in FIG. 7. Strong agreement between these two trends is apparent, although because AC measurements have more spacing between intervals the AC trend appears cleaner. The resistance generally decreases throughout formation in both cases, indicating that the decreasing electrode resistance must dominate the increasing electrolyte resistance in the first stage of formation.

FIG. 7 also shows how the two instances of water addition indicated by the SG drops do not have an obvious impact on the measured resistance, further exemplifying the limited impact of the electrolyte on the changing ohmic resistance during formation. FIG. 7 also illustrates how the small fluctuations in the measured ohmic resistance do not directly coincide with the fluctuations in cell temperature. This may indicate that the slope of the resistance trend at higher formation levels is shallow enough that the measurement resolution becomes a factor.

It can thus be said that for fast-response resistance, both DC and AC methods can be successfully employed to measure the ohmic response of a LAB, and the relative steady-state seen near 300% TC could be an indicator that no measurable amount of material is being converted at the electrodes beyond this point in the formation.

For slow-response resistance, cell set A was formed using both a pulse-up technique and a pulse-down technique to explore resistance measured with 10-second pulses during a 20 A formation. The results obtained from both techniques for all three set A cells are given in FIG. 8 for pulse-down and in FIG. 9 for pulse-up. Firstly, comparing the three individual cells shows that they are in very close agreement with each other throughout the formation, indicating high repeatability of the results. The trends themselves start with a decrease and end with a slow decay just as the fast response trends did, but the slow responses show a large peak between 25% TC and 100% TC. Furthermore, there is a substantial difference in the size and shape of the peak when comparing pulse-down to pulse-up.

Figure 10:
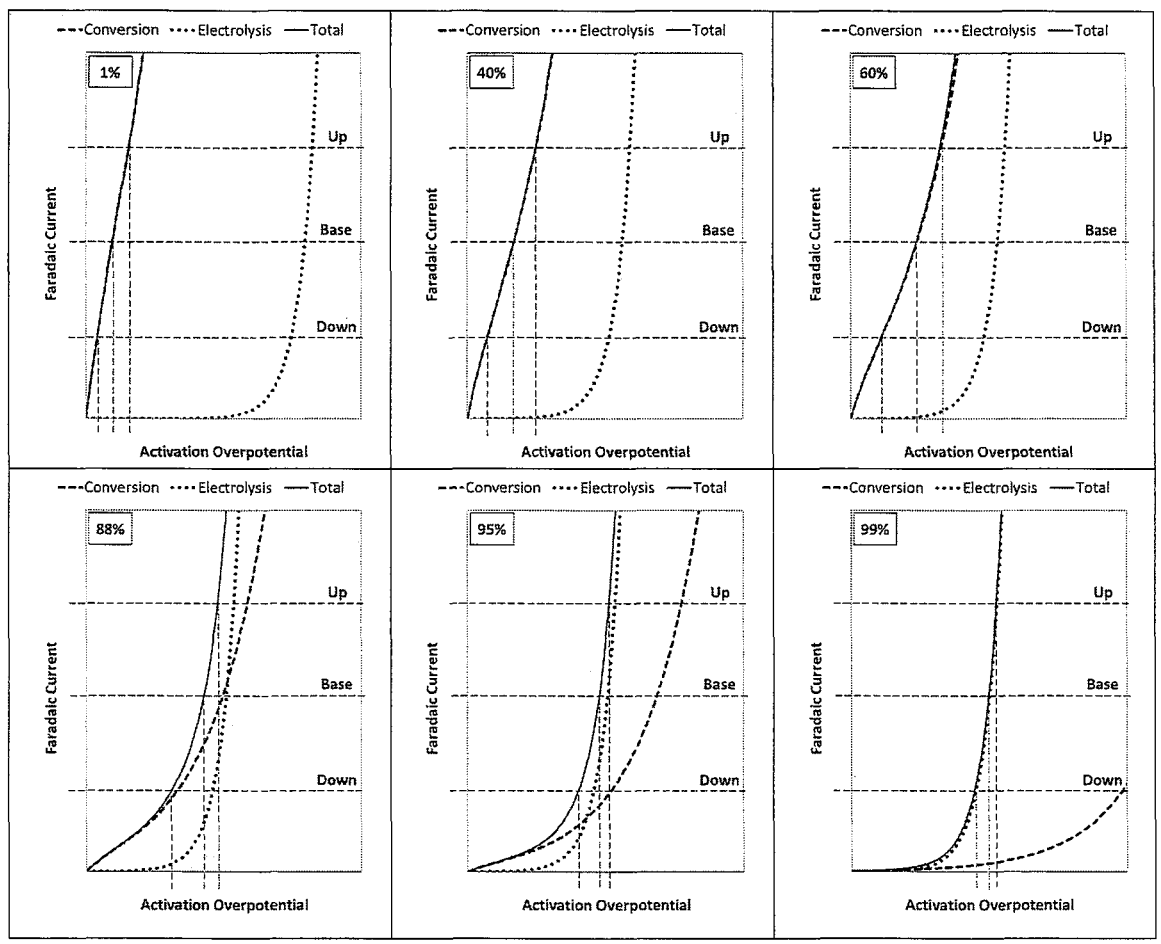
FIG. 10 shows an illustration of slow-response trends using Butler-Volmer.

In order to explain these seemingly abnormal results, the Butler-Volmer equation must be employed. FIG. 10 shows six plots intended to represent the non-ohmic responses to a pulse-down and a pulse-up at six different points in a LAB formation (or any charge). Butler-Volmer equations were created to describe both the main conversion reaction and the electrolysis side reaction, with the total charge-transfer current representing the sum of the two. The dashed horizontal and vertical lines intersect at the operating points of the total current and corresponding overpotential for states of base, pulse-up, and pulse-down. The only variable in Eq. (1) that changes from one plot to the next is the area term, where the sum of the conversion reacting area and the electrolysis reacting area is constant. So, in the beginning of the charge when only 1% of the inactive surface area has been converted, 99% of the total area is available for the conversion reaction and 1% is available for the electrolysis reaction. The two areas trend in opposite directions until their values are reversed at the end of the charge. Note that these curves shown in FIG. 21 were developed purely for illustrative purposes and do not necessarily resemble a physical system.

At 1% area conversion, the low overpotential of the main reaction allows the base current to flow at a low voltage. Pulsing the current in either direction causes a small voltage change due to the steep slope of the curve. The high overpotential for electrolysis results in virtually all of the total current flowing through the main reaction. As the available area for the main conversion reaction declines, the slope of the conversion curve decreases, such that the voltage must increase to hold the same base current and pulsing in either direction requires a larger voltage change than it did previously.

A transition period exists near 88% conversion, where the base current is being met partially by electrolysis. Pulsing down nearly erases the need for electrolysis, while pulsing up increases the current mainly through the steep electrolysis curve. As a result, the required voltage change for a pulse-up begins to shrink while that for a pulse-down remains large. At 95% conversion, most of the total current is flowing through electrolysis, such that pulsing in either direction follows a steep slope. Now the voltage change for a pulse down begins to shrink as well. Thereafter as less and less area becomes available for the main conversion reaction, the total current becomes more and more in line with the steep electrolysis curve. Thus, the voltage change required for a current pulse in either direction becomes smaller and smaller as the area conversion nears 100%.

This explanation illustrates just how crucial the Butler-Volmer equation is to understanding how slow-pulsing evolves throughout a charge or formation. To verify that these concepts do in fact apply to the present experimental data, the actual 10-second pulse responses from cell set A will now be explored more closely.

Figure 8:
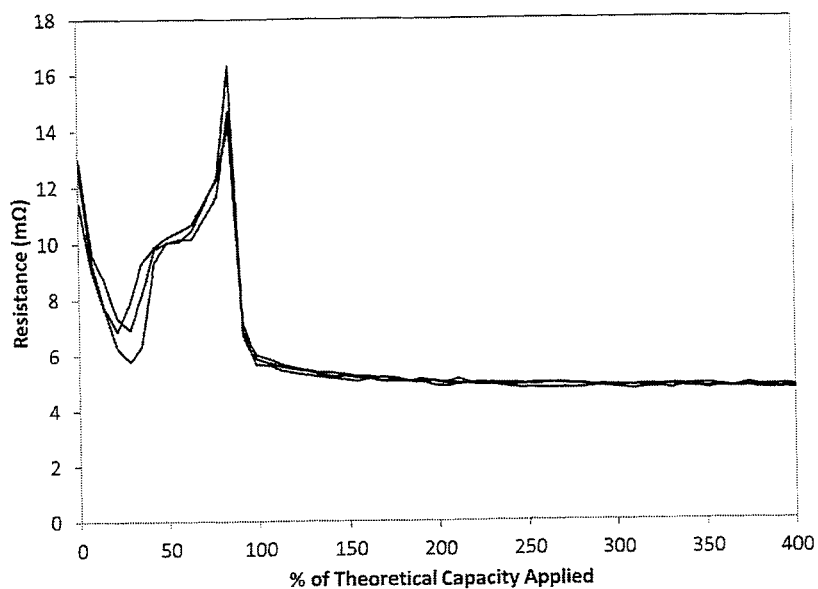
FIG. 8 shows resistance of three cells for a pulse-down DC current pulse over % theoretical capacity applied. (cell set A)
Figure 11:
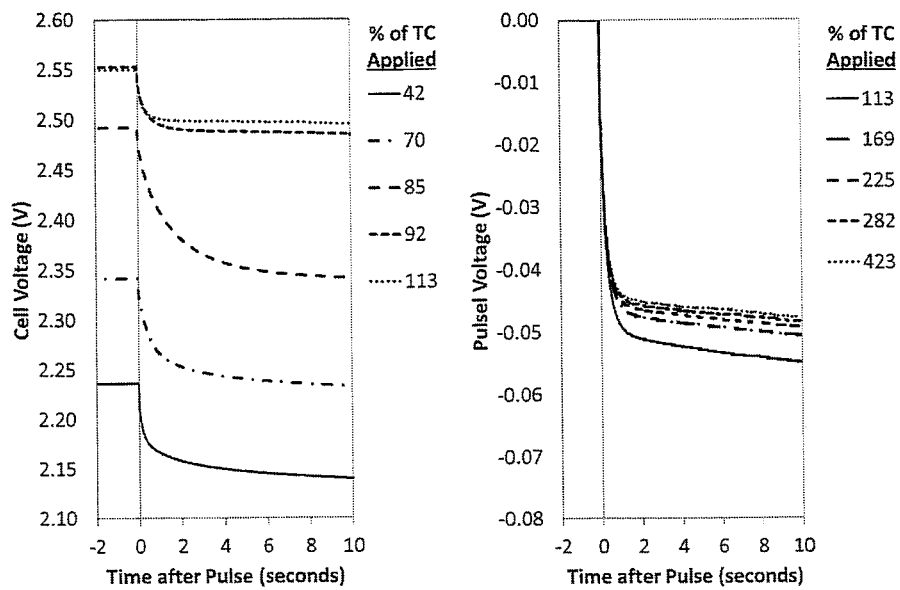
FIG. 11 shows the early-stage (left) and late-stage (right) slow-responses throughout formation using pulse-down DC current pulses. (cell set A)

FIG. 11 shows the profiles of the voltage response to the current pulses throughout the peak region of FIG. 8. At 42% TC the base voltage is low, indicating that the current is mostly going through the main reactions. When the current is suddenly reduced, there is an immediate ohmic change and the required activation overpotential is reduced according to Butler-Volmer. The EDL self-discharges through the main reactions and approaches a new equilibrium which is not quite reached in the ten seconds allotted. At 70% TC, the available area for the main reactions have decreased and thus the overpotential has increased to maintain the base current. Pulsing down now requires a larger voltage drop, as predicted in FIG. 10. At 85% TC the cell is likely in a transition region such as the 88% conversion plot in FIG. 10. The high base voltage indicates that the cell is likely gassing significantly, but the suddenly reduced current does not require a contribution from electrolysis, and the corresponding voltage drop is at its largest. At 92% TC, both the base current and the reduced current require intensive electrolysis, and the steepness of the current-voltage relationship in this region reduces the voltage drop when the current is pulsed down. At 113% TC, the voltage drop decreases even more as the available area for electrolysis gradually increases.

Figure 12:
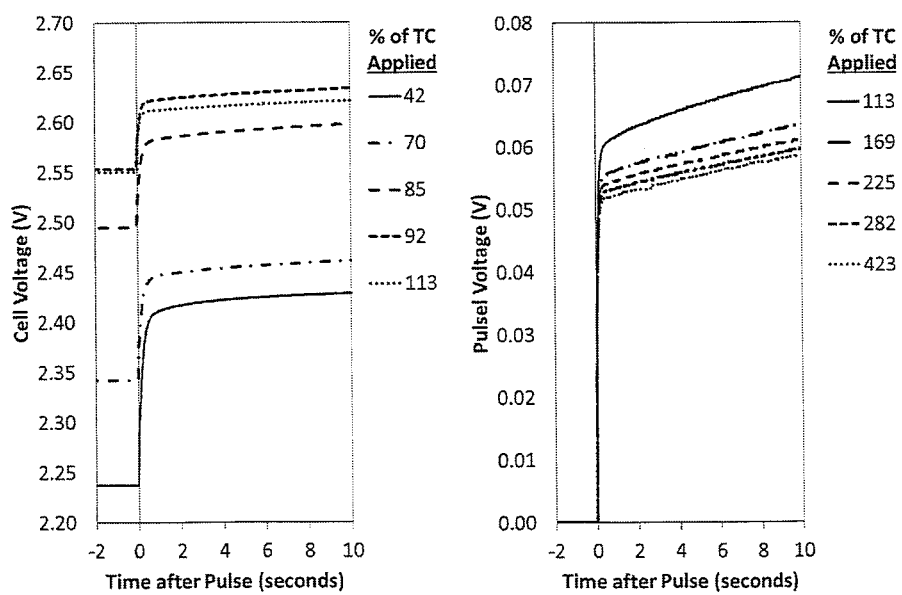
FIG. 12 shows the early-stage (left) and late-stage (right) slow-responses throughout formation using pulse-up DC current pulses. (cell set A)

After 113% TC, the size of the voltage response decreases and approaches a steady state, as shown in the trends on the right-hand side. Note that the pre-pulse voltages for these trends have all been offset to zero for convenient comparison. While the difference from one pulse to the next is very slight, there is still a measurable change, which means there is a measurable change in the amount of material that has been converted. FIG. 12 shows the equivalent data for pulsing up, for which the same principles apply. The key difference is that the voltage spikes decrease in magnitude earlier than in the case of pulsing down, as predicted in FIG. 10.

Figure 13:
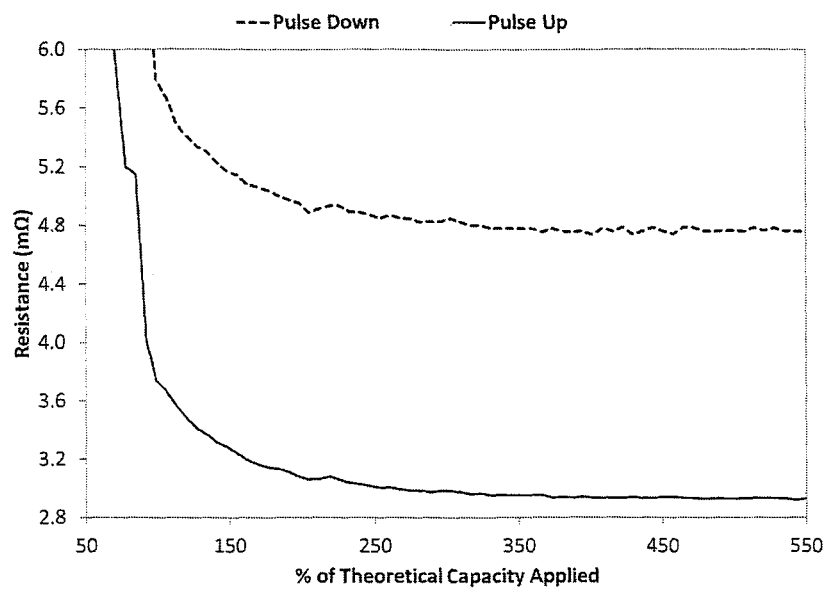
FIG. 13 shows pulse-down and pulse-up DC current pulses in slow response, approaching steady-state. (cell set A)

FIG. 13 focuses on the region of FIG. 8 and FIG. 9 pertaining to the later formation stages. Both trends indicate that a relative steady state is reached around 350% TC. According to the concepts just discussed, the steady state may indicate that continuing the formation beyond this point would yield little extra material conversion. Note that the magnitude of the pulse down resistance is larger than the magnitude of the pulse up resistance due to the lower current magnitudes used when pulsing down (as per Butler-Volmer).

Figure 14:
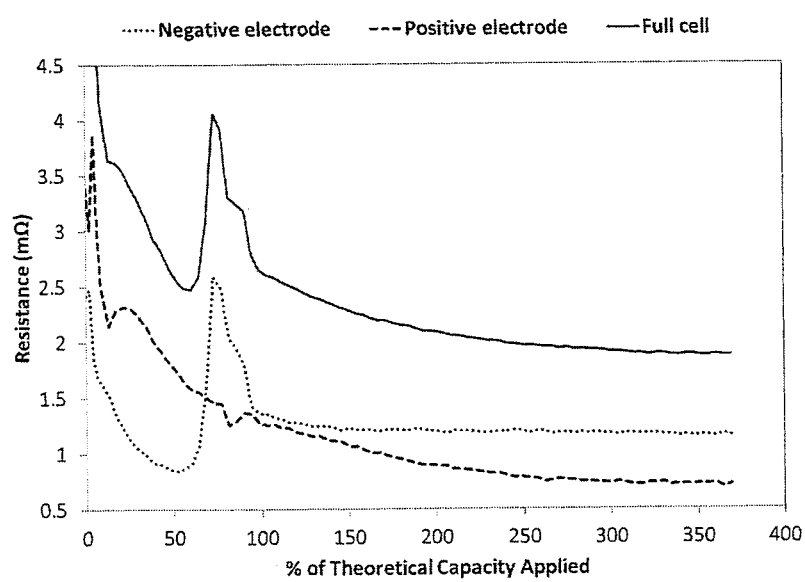
FIG. 14 shows half-cell resistance trends during formation. (cell set C)

In order to investigate the contributions of both electrodes to the total battery resistance during formation, one set C cell was formed with upward pulses while making use of the reference electrode. The results of this experiment are presented in FIG. 14. The trends show that the positive electrode resistance is almost always decreasing, while the negative electrode resistance features the large valley and peak that are observed in the full cell resistance. By 150% TC, the negative electrode resistance has stopped changing significantly, while the positive electrode resistance continues to decline up to 300% TC. This is a likely indication that the negative electrode is completely formed much earlier than the positive electrode, and the long decay in the total resistance is a result of greater formation requirements in the positive electrode.

Figure 15:
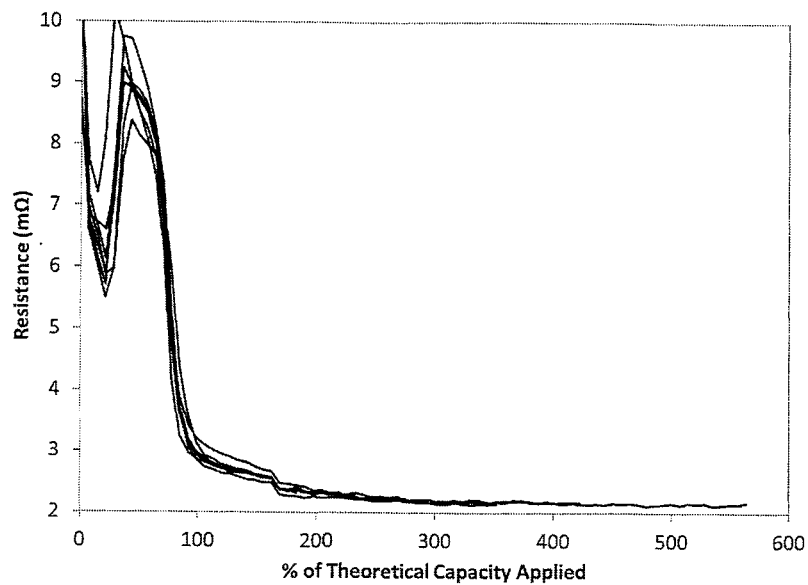
FIG. 15 shows resistance of seven cells for a pulse-up DC current pulse over % theoretical capacity applied. (cell set B)
Figure 16:
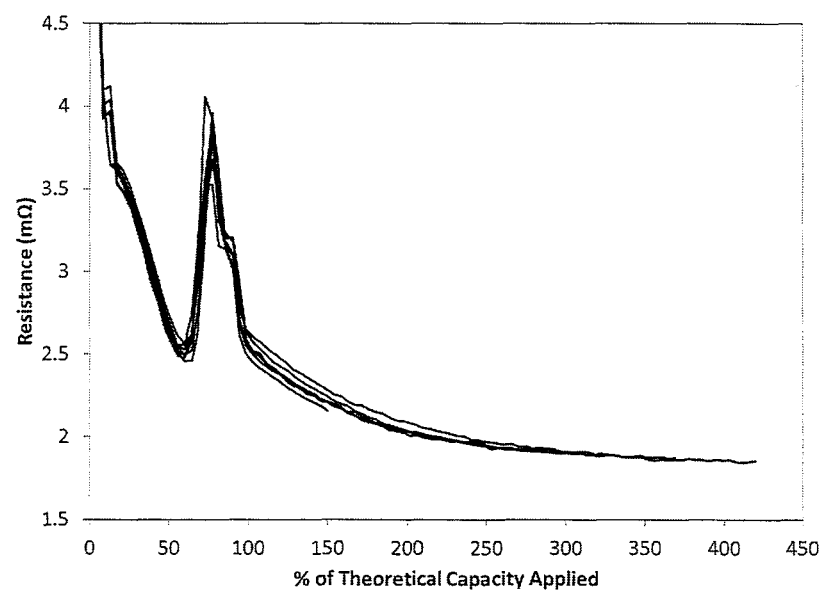
FIG. 16 shows resistance of seven cells for a pulse-up DC current pulse over % theoretical capacity applied (cell set C)

Resistance measurements were taken during additional formations, this time with the intention of correlating the resistance trends to the completeness of the formation. Seven cells of set B were formed to different levels with upward pulses, and the test was repeated on seven cells of set C. FIG. 15 shows the results of the set B formation, while FIG. 16 shows the results of the set C formation. In each dataset, there is strong agreement between each of the 7 cells. Both datasets exhibit the decrease-peak-decay trend observed previously, with key differences coming from the fact that the set B cells were formed with current steps while the set C cells were formed almost entirely at constant current. Referring again to Butler-Volmer, the sudden drop in resistance near 170% TC for the B cells can be explained by the increase in base current at the same instance. Despite this discontinuity, the decay trend continues throughout the rest of the formation.

Figure 17:
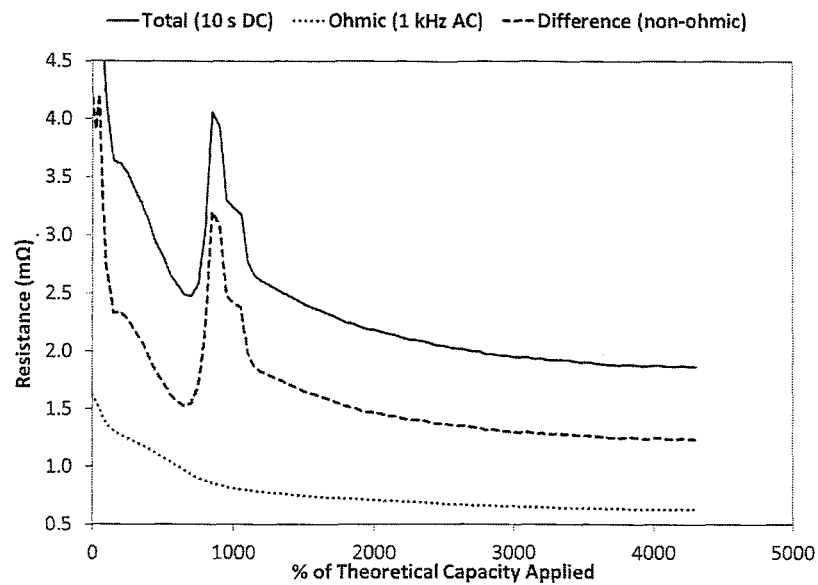
FIG. 17 shows components of resistance trends during formation. (cell set C)
Figure 18:
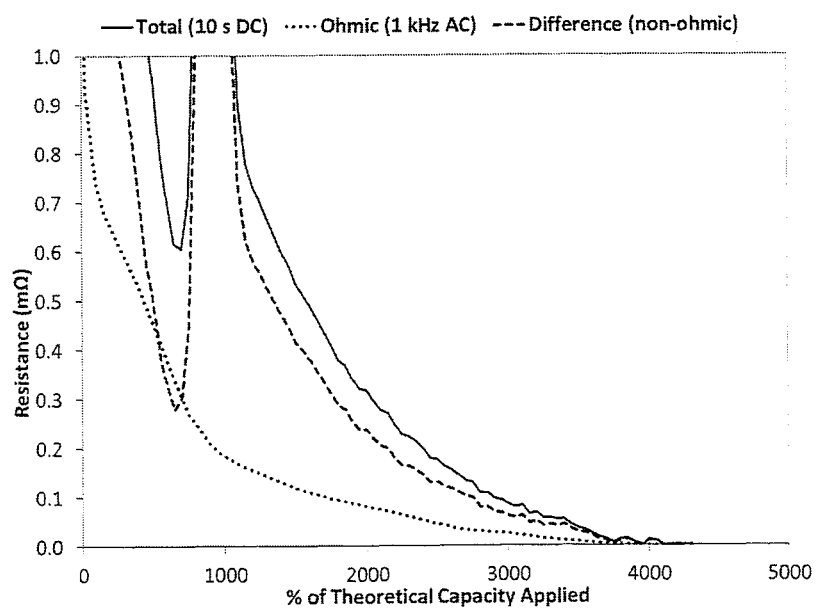
FIG. 18 shows offset components of resistance trends during formation. (cell set C)

It is important to realize that the slow response actually includes the fast response, i.e. it has both ohmic and non-ohmic components. The ohmic resistance can be subtracted from the total slow-response resistance to approximate the non-ohmic resistance. Note that the non-ohmic resistance is not necessarily equivalent to the charge-transfer resistance, as the charge-transfer resistance may not be measured in a given pulse duration due to the capacitance of the EDL. FIG. 17 illustrates the relative magnitudes of the resistance components, recalling that the magnitude of the non-ohmic resistance will increase asymptotically with the duration of the pulse since the voltage will typically continue to change if more time is given for the EDL to gain or lose charge. In FIG. 18, the three curves have been offset such that their respective minimum values are all equal to zero. This reveals how the slope of the non-ohmic trend is much greater than that of the ohmic trend, and will therefore have better sensitivity as the formation nears its end. The total resistance combines both of these, giving it the greatest slope. Thus even though a fast-response trend and a slow-response trend may reach a relative steady state at the same time, the slow-response trend would be expected to have much better sensitivity as it does so.

Figure 19:
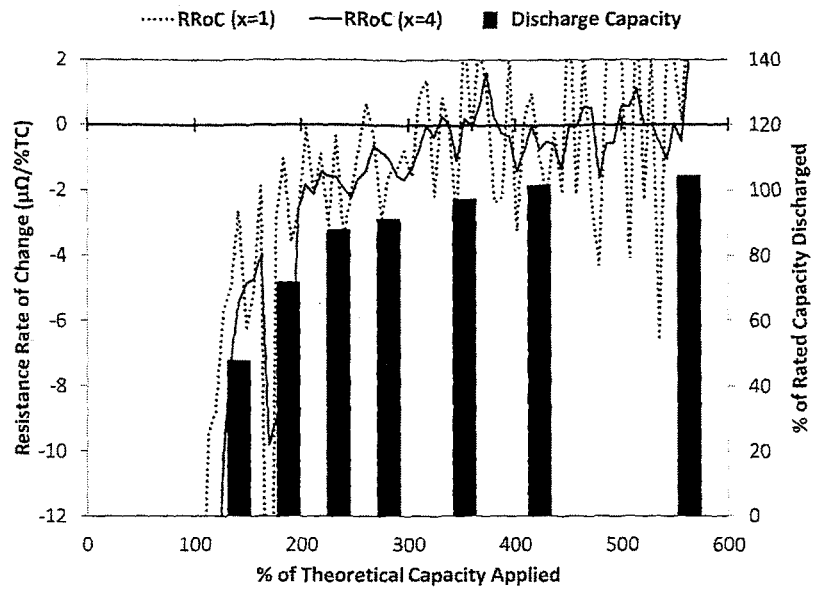
FIG. 19 shows termination (completion criterion met) during formation using rate of change of slow-response resistance compared to discharge capacity. (cell set B)

The resistance rate-of-change (RRoC) was calculated using Eq. (5). By employing Eq. (5) with higher values of x (more pulsing intervals between the two points taken into the calculation), the noise in the RRoC is reduced, as shown in FIG. 19 for cell set B and in FIG. 20 for cell set C. Thus, the value of x acts as a filtering mechanism, and in general, this results in the RRoC trend crossing the zero line at higher formation levels for larger values of x. Since the experiment with the set C cells made use of back-to-back pulsing, the RRoC trend for x=1 appears much less noisy for this cell set. For both cell sets, the RRoC trend for x=1 is effectively filtered simply by applying x=4 instead, resulting in later zero crossings.

Figure 20:
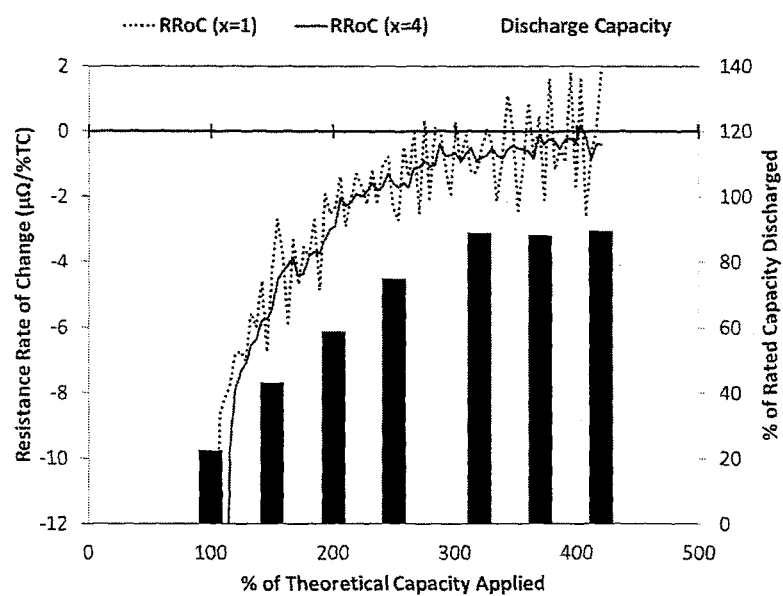
FIG. 20 shows termination (completion criterion met) during formation using rate of change of slow-response resistance compared to discharge capacity. (cell set C)

In order to evaluate the observed RRoC trends, freshly formed cells in set B and set C were subjected to a C/4 discharge, and the resulting discharge capacities were corrected to 25° C. as per Eq. (6). The bars in FIG. 19 and FIG. 20 represent these discharge capacities, which give diminishing returns as additional formation capacity is applied. Considering the relatively small amount of discharge capacity gained through additional formation after the point of zero crossing for both cell sets, RRoC appears to be a very reasonable indicator of when the formation should be considered complete. It should be noted that a given formation algorithm may leave behind unconverted electrode material which can only be formed through subsequent discharge/recharge cycles. This is why the thicker-plated cell set C does not achieve rated capacity on the first discharge, as shown in FIG. 20. The "completeness" detected using RRoC is thus not necessarily the point where the electrodes are 100% converted, but rather the point where a given formation algorithm has converted all that it can, and is now gassing 100% of the applied current.

Depending on how much filtering is applied to the RRoC trends, the RRoC zero crossing will correspond to different levels of completeness. Applying more filtering (e.g. higher values of x) will result in a longer formation but also a more complete formation. In theory, a manufacturer employing RRoC can tune the level of filtering applied to the trend based on the customers' needs, such that a course filter results in a less complete formation in order to reduce formation time, while a fine filter forces the formation to a more completed state.

Figure 21:
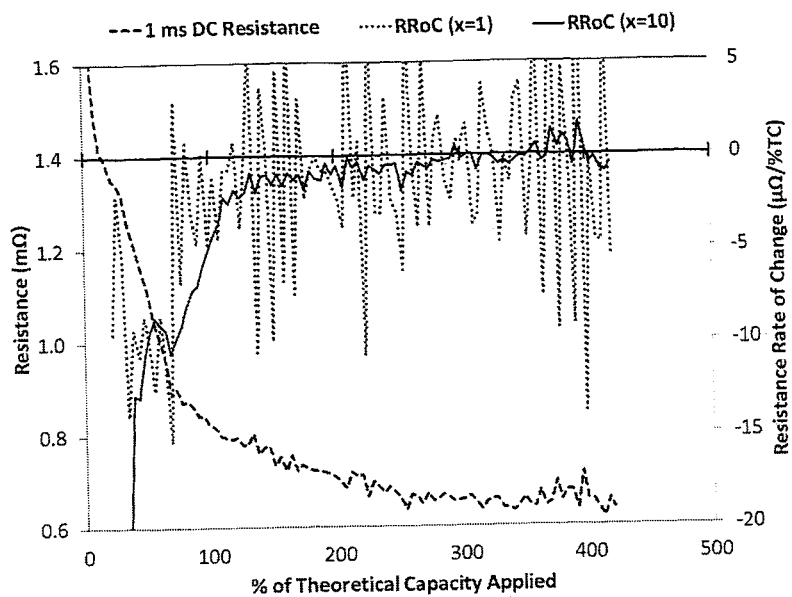
FIG. 21 shows rate of change of DC ohmic resistance as a completion criterion. (cell set C)

RRoC was also applied to the fast-response resistance data. FIG. 21 shows the results for the 1 millisecond DC ohmic resistance measured by the power-cycler built-in function. For x=1, the RRoC is already crossing zero near 100% TC due to the very small changes in the resistance from one point to the next. Reasonable zero crossings are achieved only by applying x=10. More filtering is required in comparison to the slow-response trends, due to the fact that the fast-response resistance trend is less sensitive than the slow-response resistance trends, as discussed previously.

Figure 22:
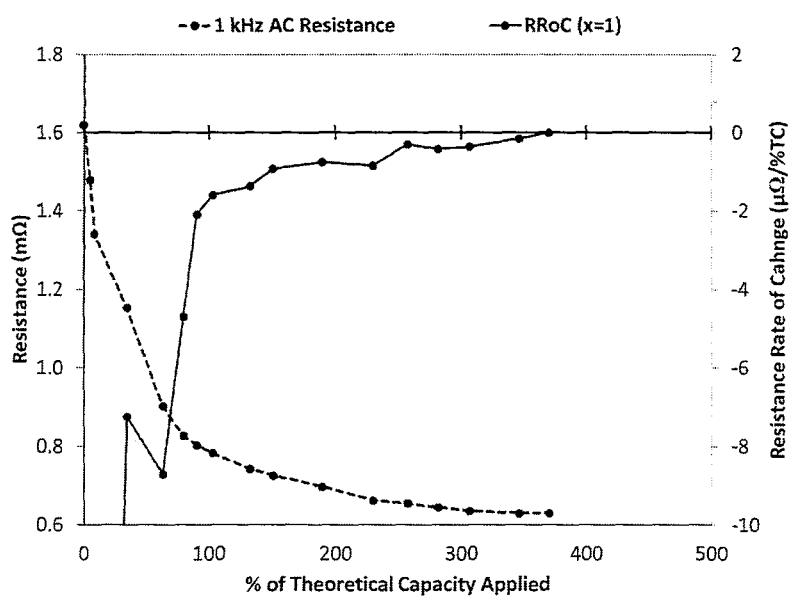
FIG. 22 shows rate of change of AC ohmic resistance as a completion criterion. (cell set C)

FIG. 22 shows the RRoC for the 1 kHz ohmic resistance measured manually by the handheld battery analyzer. Since there are far fewer data points in this trend than in those previously discussed, it is relatively easy to interpret. The only zero crossing occurs on the last data point near 370% TC, which is near the completion point indicated by the slow-response trend of the C cells. This shows how the frequency of resistance measurement intervals can influence the RRoC trend.

These data indicate that ohmic resistance trends as demonstrated here can be used as a completeness indicator during formation. In some embodiments, manual AC injection measurements can be made by operators at a LAB manufacturing plant to spot-check batteries as they form and end the formation when they judge the resistance trend has slowed enough. In some embodiments, automated DC fast-pulsing or AC injection techniques can be implemented in the formation charger itself provided these could match the sensitivity required for the slow-response resistance trends demonstrated here.

Lead-acid batteries were successfully formed with specifically designed pulsing strategies to evaluate resistance trends as the batteries form. These trends were then correlated to the dischargeable capacity obtained during the formation. As a result, methods and systems have been developed which allow for formation completeness to be detected via non-invasive in situ methods using minor control changes to existing infrastructure, as described in these Examples and in the corresponding Figures.

From the experimental results, the following major conclusions can be drawn:

1. As a lead acid battery nears the end of formation, the measured battery resistance decays downward. This is the case for both the ohmic resistance and the non-ohmic resistance.
2. The more a lead-acid battery forms, the less discharge capacity output can be obtained per unit of additional formation capacity input. This trend of diminishing returns correlates with the decaying resistance, which can be rationalized through scientific theory regarding lead-acid batteries and general electrochemistry.
3. Both fast-response and slow-response resistances can be used as completeness indicators. However, slow-response resistance trends are more sensitive during formation as they contain both the ohmic and non-ohmic responses. Furthermore, slow-response resistance trends are easier to obtain accurately since no AC waveforms or fast-logging of data are required.
4. Pulsing strategies are useful for measuring slow-response resistance during formation. Some embodiments have high sensitivity to accommodate the small changes that occur towards the end of formation, as well as multiple coincident measurements for averaging such as back-to-back pulsing.
5. Calculating rate of change of resistance gives rise to a numeric target representing the point at which formation should be terminated. This target is a value of zero rate of change.
6. Inherent noise when measuring small resistance changes suggests that averaging or filtering be applied to the rate of change of resistance, and the resolution of the filter can shift the observed zero crossing. A tunable filter can then allow for batteries to be formed more fully when the intended end-user requires it (e.g. off-grid solar storage applications).

Method Example

Figure 23:
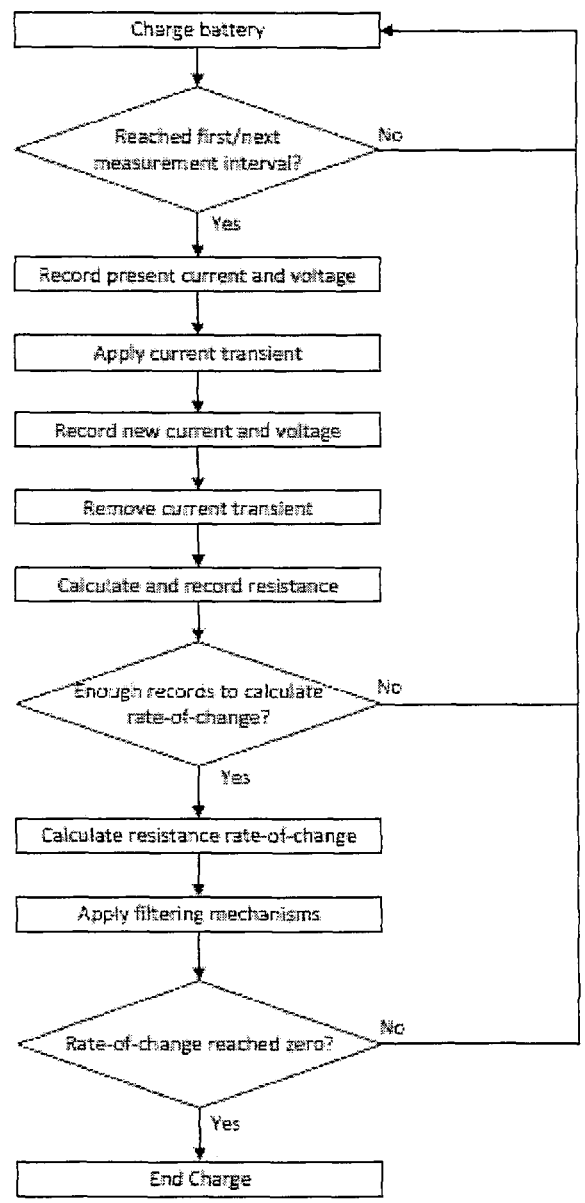
FIG. 23 shows an example method of battery charging.

A method of battery charging is shown in FIG. 23. In this example, battery charging begins for a given battery. Upon reaching the first measurement interval (depicted as containing the performance of one measurement method: DC current pulse), reference current and voltage are recorded, a transient current is pulsed, current and voltage during the pulse are recorded, and resistance is calculated according to an equation described above. Once a sufficient (for example, as specified by the user or as predetermined by the use case or application) number of measurement intervals has been performed, the sequence is complete and the rate of change of resistance is calculated according to an equation described above. The sequence is repeated and the rates of change of resistance are compared until it is determined that the rate of change of resistance has approached, or alternative reached zero, which meets the completion criterion for this example and results in end of battery charging.

The invention claimed is:

1. A battery charging system connected to a power source for charging of one or more batteries, each battery having a positive terminal and a negative terminal, the system comprising:
   a control module having a microprocessor and microprocessor-readable instruction code,
   wherein the control module is electrically interposed between the power source and one or more output electrical components and controls flow of current and voltage to the output electrical components,
   each output electrical component being electrically connected to the control module, one of the battery positive terminals of the one or more batteries, and its corresponding battery negative terminal, each forming a circuit between that component and its corresponding battery wherein there are one or more circuits; and
   sensors attached to each circuit, wherein the sensors provide information at least indicative of resistance in the battery corresponding to that circuit to an analysis module, the analysis module having a microprocessor and microprocessor-readable analysis code;

in which the analysis module computes rate of change of resistance and compares the computed rate of change of resistance to a completion criterion for each battery, in which the completion criterion is met when the computed rates of change of resistance indicate that resistance is approaching a steady state.

2. The system of claim 1 in which the control module halts battery charging for a given battery upon notice from the analysis module that the completion criterion is met.

3. The system of claim 1 in which the control module and the analysis module are combined, the microprocessor is shared and has microprocessor-readable instruction code and microprocessor-readable analysis code.

4. The system of claim 1 further comprising one or more completion indicators which are activated once the completion criterion is met for its corresponding battery.

5. The system of claim 1 in which the sensors providing information at least indicative of resistance comprise a voltage sensor, attached to each circuit between the positive battery terminal and the negative battery terminal; and a current sensor, attached to each circuit between its corresponding battery and the output electrical component; in which resistance is calculated using a resistance equation.

6. The system of claim 1 in which the instruction code has a measurement method comprising a DC current pulse, in which there is a step change in current.

7. The system of claim 6 in which the DC current pulse is a step change in current that is proportional to a reference current, in which the step change in current can be expressed as a percentage of the reference current.

8. The system of claim 7 in which the DC current pulse is selected from a current within about 300%, 110%, 101%, 99%, 10%, or 0% of the reference current.

9. The system of claim 6 in which the DC current pulse has a preselected time-based duration, the duration selected from a time within 300, 60, 30, 15, or 1 second.

10. The system of claim 1 in which the instruction code has a measurement method comprising an AC current injection having a frequency between about 1 Hz to about 1 kHz and having an amplitude between about 1 microampere and 100 milliampere.

11. The system of claim 5 further comprising a temperature sensor, in which the temperature sensor is used to adjust calculated resistance as based upon the voltage sensor and current sensor.

12. The system of claim 6 in which the control module has instruction code to perform one or more measurement methods during a measurement interval for each battery.

13. The system of claim 12 in which the control module has instruction code to perform a plurality of measurement intervals in a sequence, the sequence being performed between every ten minutes and every five hours.

14. The system of claim 12 in which the analysis module has analysis code to perform a calculation of resistance using the voltage sensor and the current sensor for each measurement method.

15. The system of claim 12 in which the analysis module has analysis code to combine results of the one or more measurement methods performed during each measurement interval.

16. The system of claim 13 in which the analysis module has analysis code to compute rate of change of resistance using at least two measurement intervals in sequence and using a rate of change of resistance equation, and to compare to the completion criterion, where the rate of change is computed over time, charge ampere-hours, or charge energy.

17. The system of claim 16 in which the analysis module has analysis code to compute the moving average of adjacent intervals in the sequence, to compute the rate of change of resistance.

18. The system of claim 16 in which the measurement intervals quantity used to compute the rate of change of resistance is preselected to result in the completion criterion being met when the given battery is charged to between 90% and 100% of complete charge.

19. The system of claim 16 where the analysis module has analysis code to compute a plurality of rates of change of resistance over a corresponding number of sequences.

20. The system of claim 16 in which the completion criterion is met when the computed rates of change of resistance reach a preselected value.

* * * * *